US006483717B1

(12) United States Patent
Ives et al.

(10) Patent No.: US 6,483,717 B1
(45) Date of Patent: Nov. 19, 2002

(54) SWITCH INTEGRAL TO A LATCH ASSEMBLY

(75) Inventors: Thomas W. Ives, Boise, ID (US); Richard G. Sevier, Boise, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/562,792

(22) Filed: May 2, 2000

(51) Int. Cl.[7] .................................................. H05K 7/14
(52) U.S. Cl. ........................ 361/801; 361/759; 361/802
(58) Field of Search .................................. 361/725, 726, 361/741, 756, 759, 796, 801, 802; 439/157–160, 372

(56) References Cited

U.S. PATENT DOCUMENTS 3,228,740 A  *  1/1966  Lundell ....................... 312/320
5,208,735 A  *  5/1993  Twachtmann et al. ....... 361/391
5,343,009 A  *  8/1994  Araoka et al. ............... 200/322
5,642,263 A  *  6/1997  Lauruhn ...................... 361/801
5,918,956 A  *  7/1999  Scholder ................... 312/223.2
5,989,043 A  * 11/1999  Han et al. .................... 439/157
6,147,878 A  * 11/2000  Heselton ...................... 361/798
6,266,248 B1 *  7/2001  Hanas et al. ................. 361/752

* cited by examiner

Primary Examiner—David L. Talbott
Assistant Examiner—Tuan Dinh

(57) ABSTRACT

A switch integral to an insert/extract latch assembly. The switch is positioned between a latch and a retainer and may be compressed between the latch and the retainer. The switch is connected to a warning circuit and may function to de-energize the electronic assembly upon disengagement of the latch from the retainer. The retainer is movable between first and second positions. In the first position, the retainer is disengaged from the latch, the switch contacts are open and the latch is free to operate. In the second position, the retainer is engaged with the latch, the switch is compressed between the latch and the retainer and the switch contacts are closed.

4 Claims, 6 Drawing Sheets

SWITCH INTEGRAL TO A LATCH ASSEMBLY

FIELD OF THE INVENTION

The present invention relates generally to switches and more particularly to a switch integral to a latch assembly.

BACKGROUND

Electronic assemblies may be configured and assembled in such a manner that one or more printed circuit assemblies (PCA) are housed in a single chassis. Individual PCAs may be mounted in structural modules for insertion into the chassis. Alternately, the PCA may be fabricated including an edge configured for sliding engagement with the electronic assembly chassis. Each PCA includes one or more connectors for conductively connecting the PCA to other electrical or electronic equipment or components forming the electronic assembly. Each PCA commonly includes a first connector portion which engages with a second connector portion inside the chassis, most commonly located on an end plate.

Each PCA may include an insert/extract latch assembly which facilitates insertion of the PCA into and extraction of the PCA from the chassis. A latch is connected to the PCA or the structural module of the PCA and is employed to apply leverage against the structural module to effect complete insertion of the PCA into the chassis and engagement of the connectors. The chassis may include a lip or frame surrounding an aperture in the faceplate of the electronic assembly housing through which the PCA is insertable. A retainer is employed to eliminate any tendency of the latch to become disengaged inadvertently. The insert/extract latch assembly facilitates engaging and disengaging the connector component parts when inserting and removing the PCA from the chassis.

Accidental removals of PCAs from the chassis can occur which may result in adverse effects on system operation. It may therefore be advantageous to provide an insert/extract latch assembly which include an early removal warning switch.

SUMMARY

The present invention is directed to a switch integral to an insert/extract latch assembly. The switch is positioned between a latch and a retainer and may be compressed between the latch and the retainer. The retainer is movable between first and second positions. In the first position, the retainer is selectively disengaged from the latch, the switch contacts are open and the latch is free to operate. In the second position, the retainer is selectively engaged with the latch, the switch is engaged between the latch and the retainer and the switch contacts are closed.

An insert/extract latch release warning assembly, according to the present invention, includes an insert/extract latch assembly attached to an electronic assembly configured to exert an insert/extract force between the PCA or the structural module of the PCA and the chassis. The insert/extract latch release warning assembly also includes a switch integral to an insert/extract latch assembly for operating a warning circuit for the electronic assembly. The switch is conductively connected to a warning circuit which may operate to deenergize the electronic assembly upon disengagement of the latch from the retainer.

The retainer may be configured as a biased member and is configured to exert a compressive force against the latch. In a first position, the biased member may be depressed away from the latch releasing the latch for operation. In a second position, the biased member returns to a normal position retaining the latch and compressing the switch disposed between the latch and the biased member.

Alternately, the retainer may be configured as a rotatable member connected to the PCA and rotatable about an axis. The rotatable member may be twisted or rotated to a first position wherein the latch is operable. In a second position, the rotatable member is twisted or rotated so that the head of the retainer extends over a portion of the latch retaining the latch and compressing the switch disposed between the latch and the biased member.

In one embodiment of the invention, the switch is integral to the retainer. Alternate embodiments of the invention are possible wherein the switch is integral to the latch. The switch may be configured as a micro switch physically connected to the retainer, conductively connected to a warning circuit and engageable between the latch and the retainer. Alternately, the switch may be configured as a capacitive sensor, a photo-interrupter device, a hall device or switching may be achieved by existing position sensing technologies.

DESCRIPTION

Figure 1:
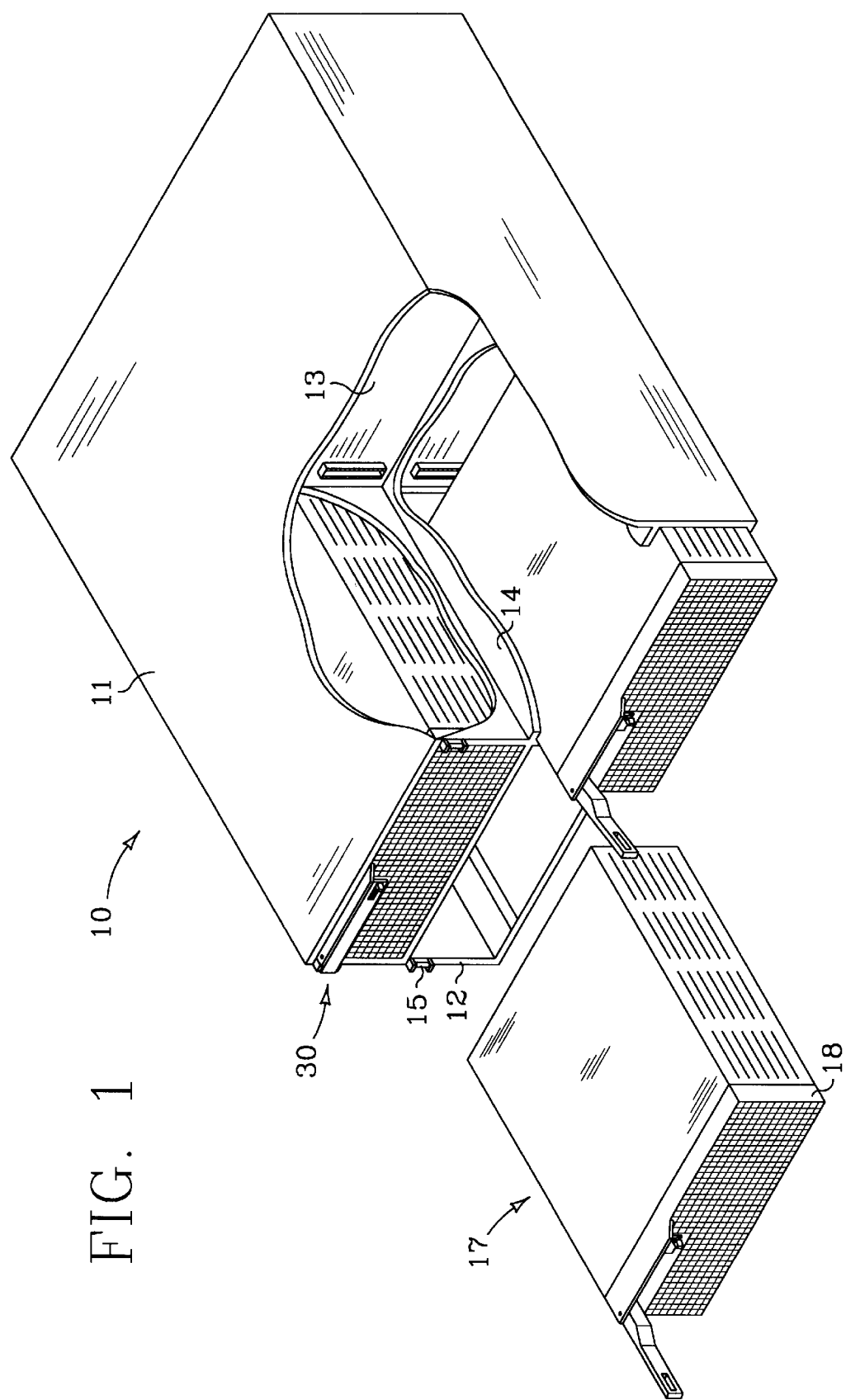
FIG. 1 is a perspective representational view of an electronic assembly including a switch integral to an insert/extract latch assembly.
Figure 2:
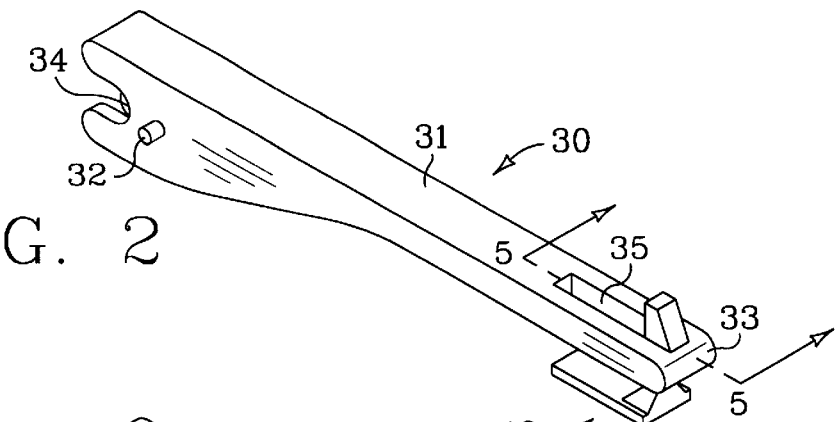
FIG. 2 is a perspective representational view of a switch integral to an insert/extract latch a assembly.
Figure 3:
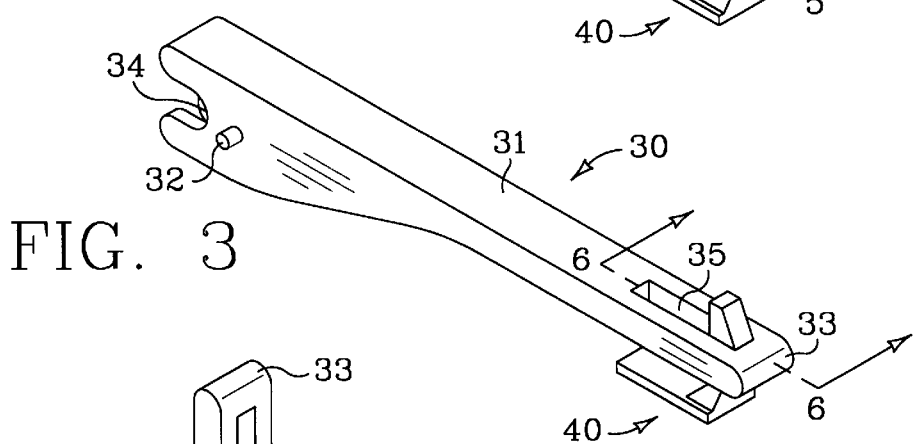
FIG. 3 is a perspective representational view of a switch integral to an insert/extract latch assembly.
Figure 4:
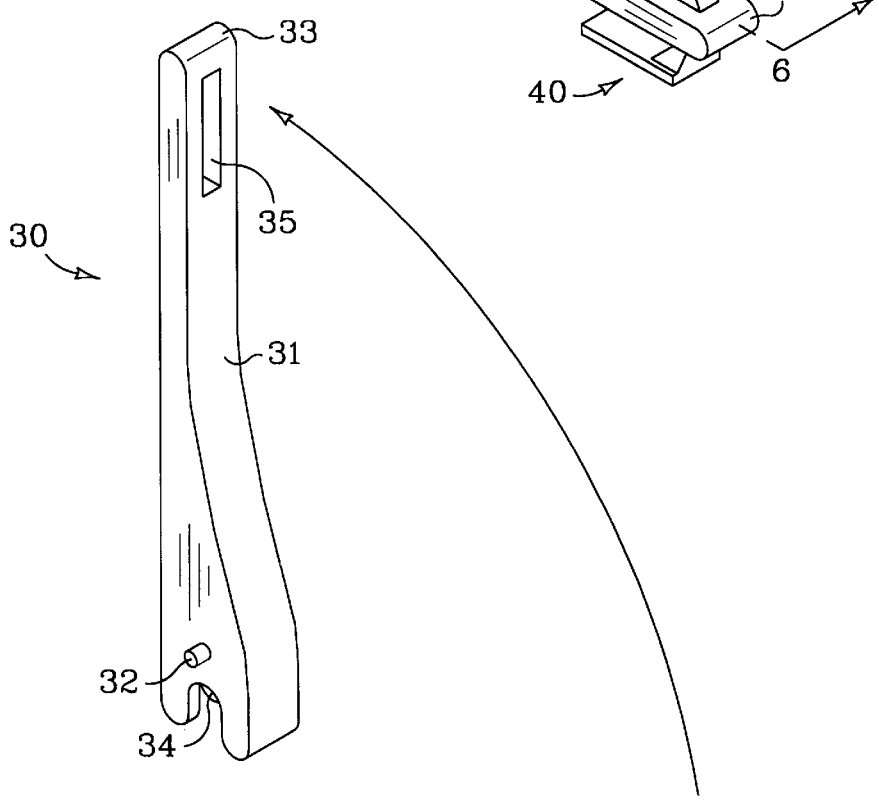
FIG. 4 is a perspective representational view of a switch integral to an insert/extract latch assembly.
Figure 4:
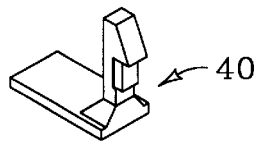

Referring to FIGS. 1 through 14, a switch integral to an insert/extract latch according to the present invention will be more fully described. FIG. 1 shows a perspective representational view of electronic assembly 10 including housing 11. Housing 11 includes chassis 12 which provides structural framework for housing 11 and support for printed circuit assembly 17. Housing 11 may be divided into one or more bays 14. Each bay 14 typically includes end plate 13. Printed circuit assembly 7 includes structural module 18. Printed circuit assembly 17 is slidably engageable in housing 11. Chassis 12 includes latch engaging element 15. Electronic assembly 10 also includes insert/extract latch release warning assembly 30.

Referring to FIGS. 2 through 10, insert/extract latch release warning assembly 30, includes lever 31 having pivot pin 32 for connection to printed circuit assembly 17 (shown in FIG. 1). Lever 31 includes a first end configured as lever arm 33 and a second end configured as chassis engaging element 34. According to one embodiment of the invention, lever 31 includes cutout 35 through which retainer 40 passes. This feature of the invention permits mounting of retainer 40 in the footprint of lever 31 thereby saving space.

Figure 5:
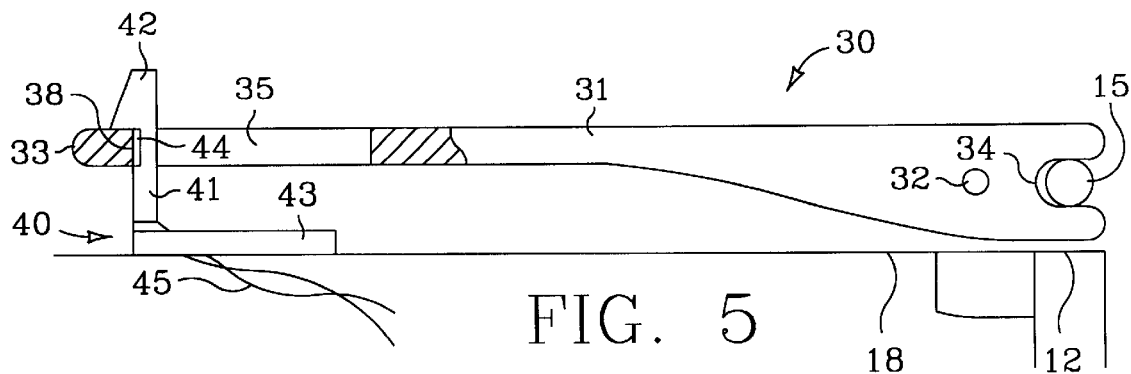
FIG. 5 is a side representational view of a switch integral to an insert/extract latch assembly.
Figure 6:
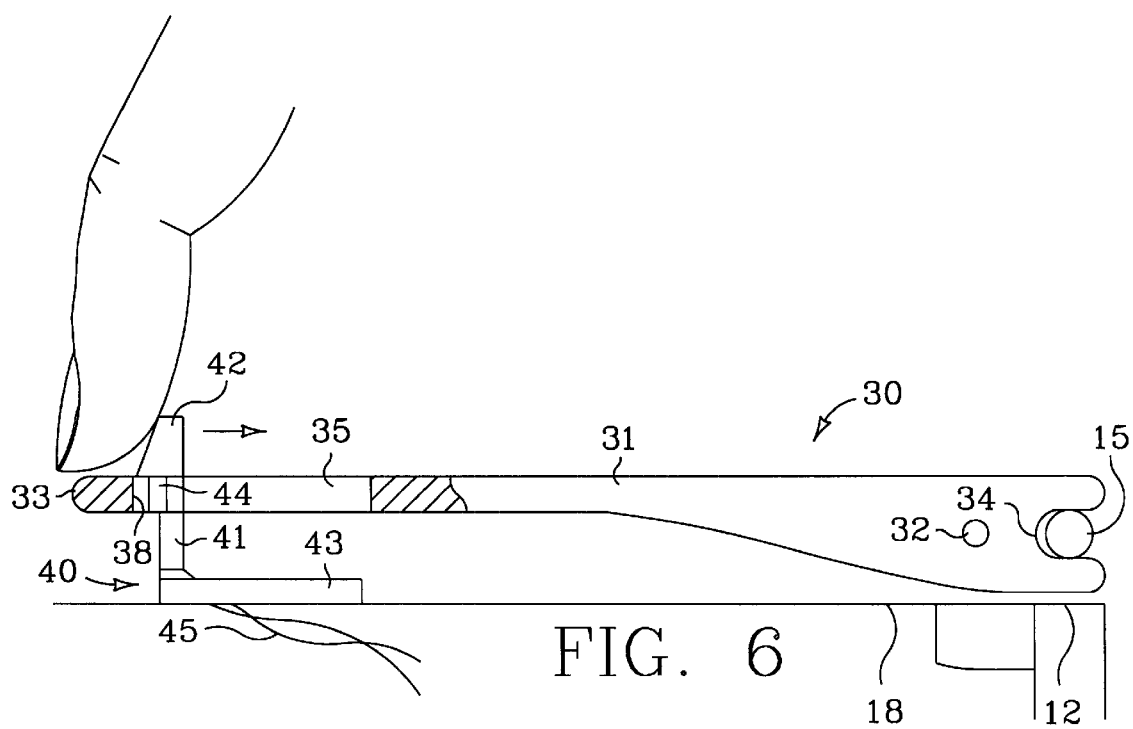
FIG. 6 is a side representational view of a switch integral to an insert/extract latch assembly.
Figure 7:
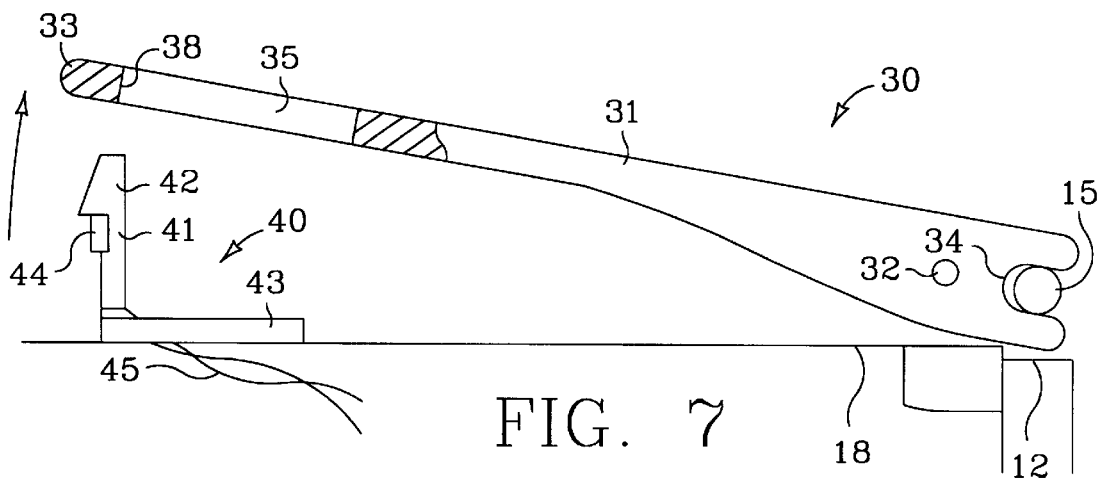
FIG. 7 is a side representational view of a switch integral to an insert/extract latch assembly.
Figure 8:
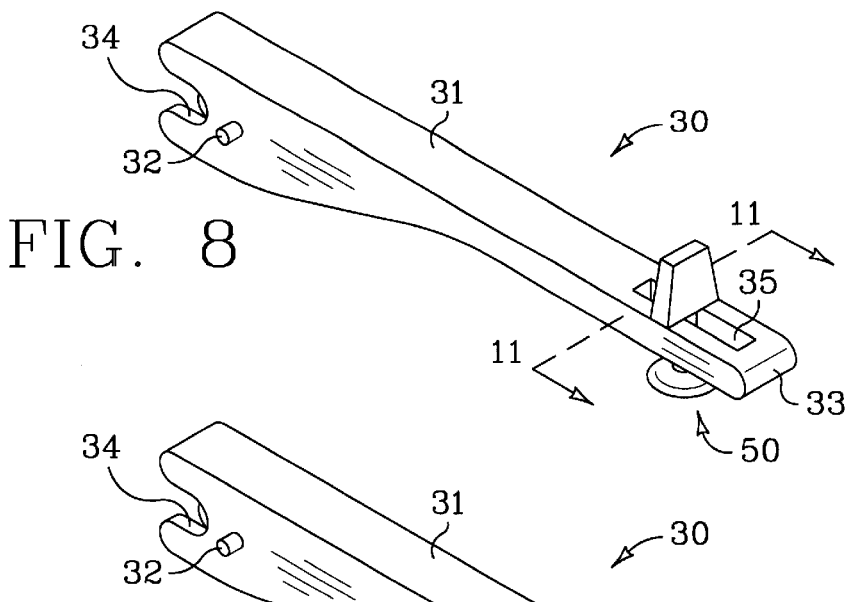
FIG. 8 is a perspective representational view of a switch integral to an insert/extract latch assembly.
Figure 9:
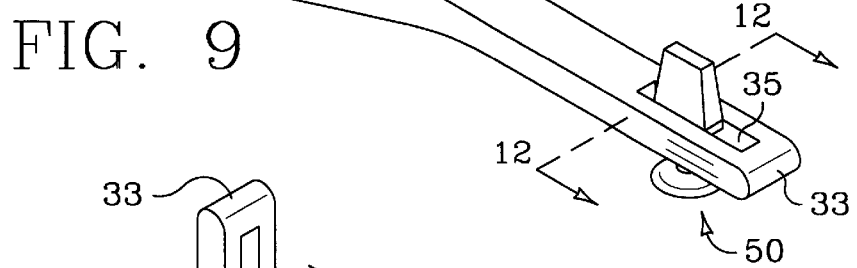
FIG. 9 is a perspective representational view of a switch integral to an insert/extract latch assembly.
Figure 10:
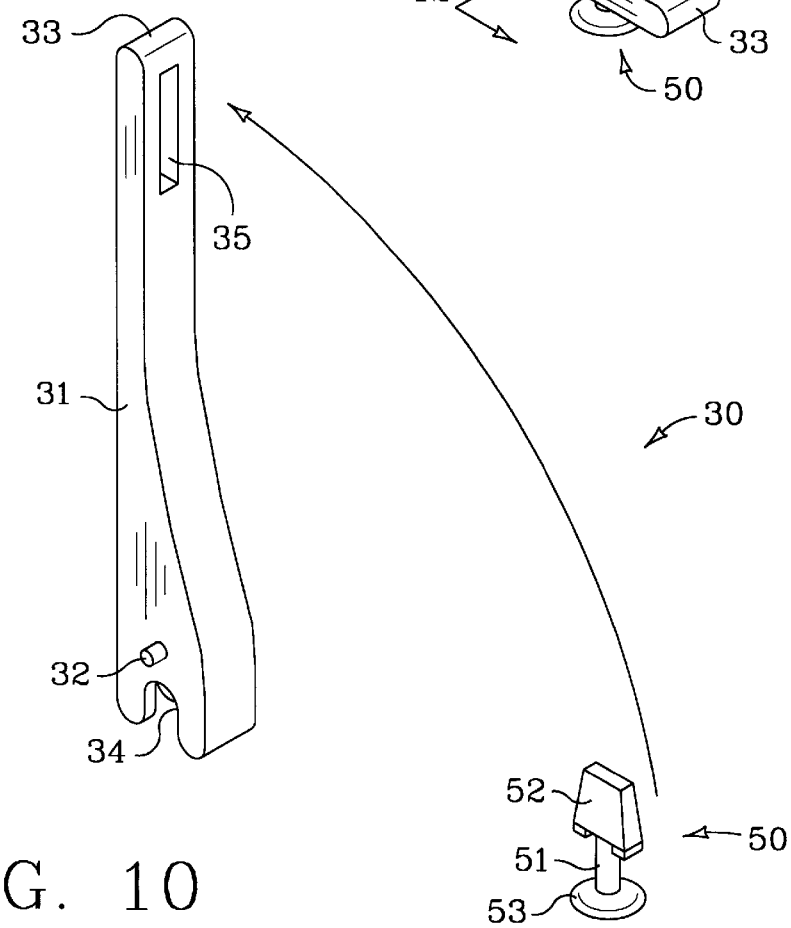
FIG. 10 is a perspective representational view of a switch integral to an insert/extract latch assembly.
Figure 11:
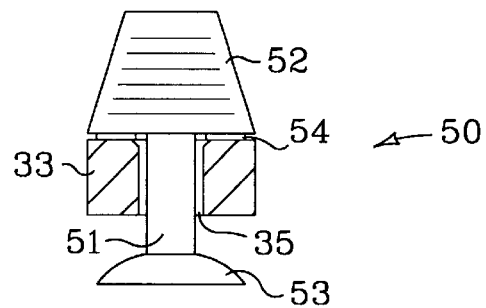
FIG. 11 is a cross-sectional representational view of a switch integral to an insert/extract latch assembly.
Figure 12:
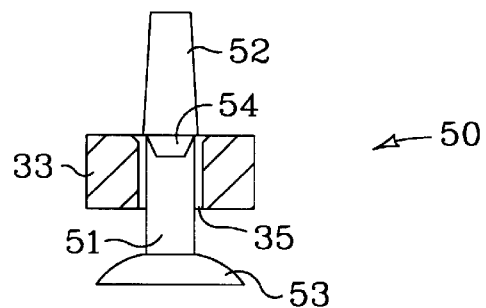
FIG. 12 is a cross-sectional representational view of a switch integral to an insert/extract latch assembly.
Figure 13:
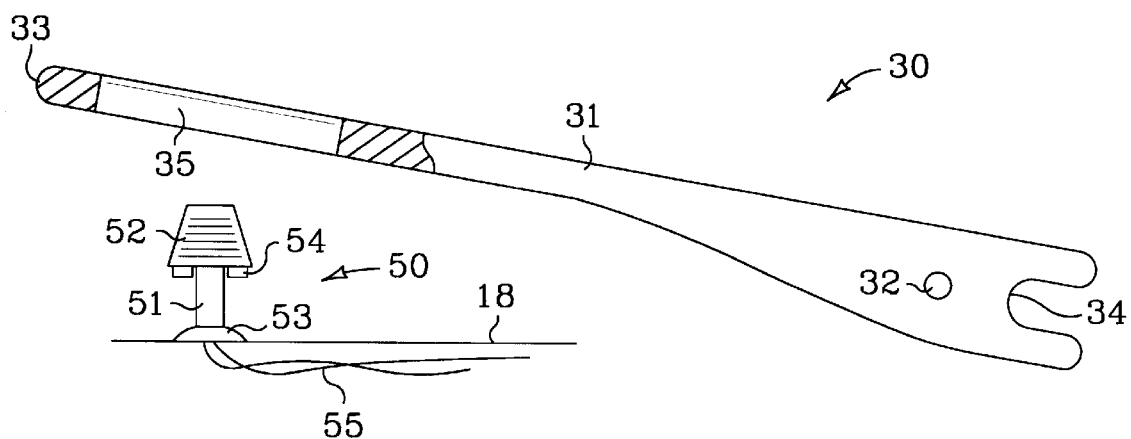
FIG. 13 is a side cross-sectional representational view of a switch integral to an insert/extract latch assembly.

As shown in FIGS. 5 through 6, retainer 40 includes neck 41 extending from base 43. Head 42 is contiguous to and extends from neck 41. Switch 44 is shown connected to retainer 40 on the face of neck 41. In this instance, switch 44 is configured as a micro switch having conductor 45 which passes through the core of neck 41. Lever 31 is operable between a first position wherein retainer 40 is selectively disengaged with lever 31, (FIG. 7), and a second position wherein retainer 40 is selectively engaged with lever 31, (FIGS. 5 and 6). As shown in FIGS. 5 and 6, retainer 40 is biased towards contact point 38 of cutout 35 such that in the engaged position, switch 44 is held in compression between contact point 38 of cutout 35 and neck 41 of retainer 40. This features assures that when insert/extract latch release warning assembly 30 is in the engaged position, a compressive force is exerted against switch 44 between retainer 40 and contact point 38 of cutout 35. In the engaged position, switch 44 is closed and in the disengaged position, switch 44 is open.

In an alternate embodiment of the invention shown in FIGS. 8 through 13, insert/extract latch release warning assembly 30 includes retainer 50. As shown in FIGS. 10 through 13, retainer 50 includes neck 51 connected to and extending from base 53. Retainer 50 also includes head 52 which is contiguous to and extends from neck 51. Head 52 is rotatable on neck 51. Switch 54 is shown connected to the underside of head 52. Conductor 55 may be routed through a passage formed within neck 51 of retainer 50.

Lever 31 is biased towards a disengaged position creating a compressive force between an upper face of lever 31 against switch 54. In the engaged position, switch 54 is open and electronic assembly 10 operates normally. In the disengaged position, switch 54 closes and electronic assembly 10 may be de-energized through operation of warning circuit 60.

Figure 14:
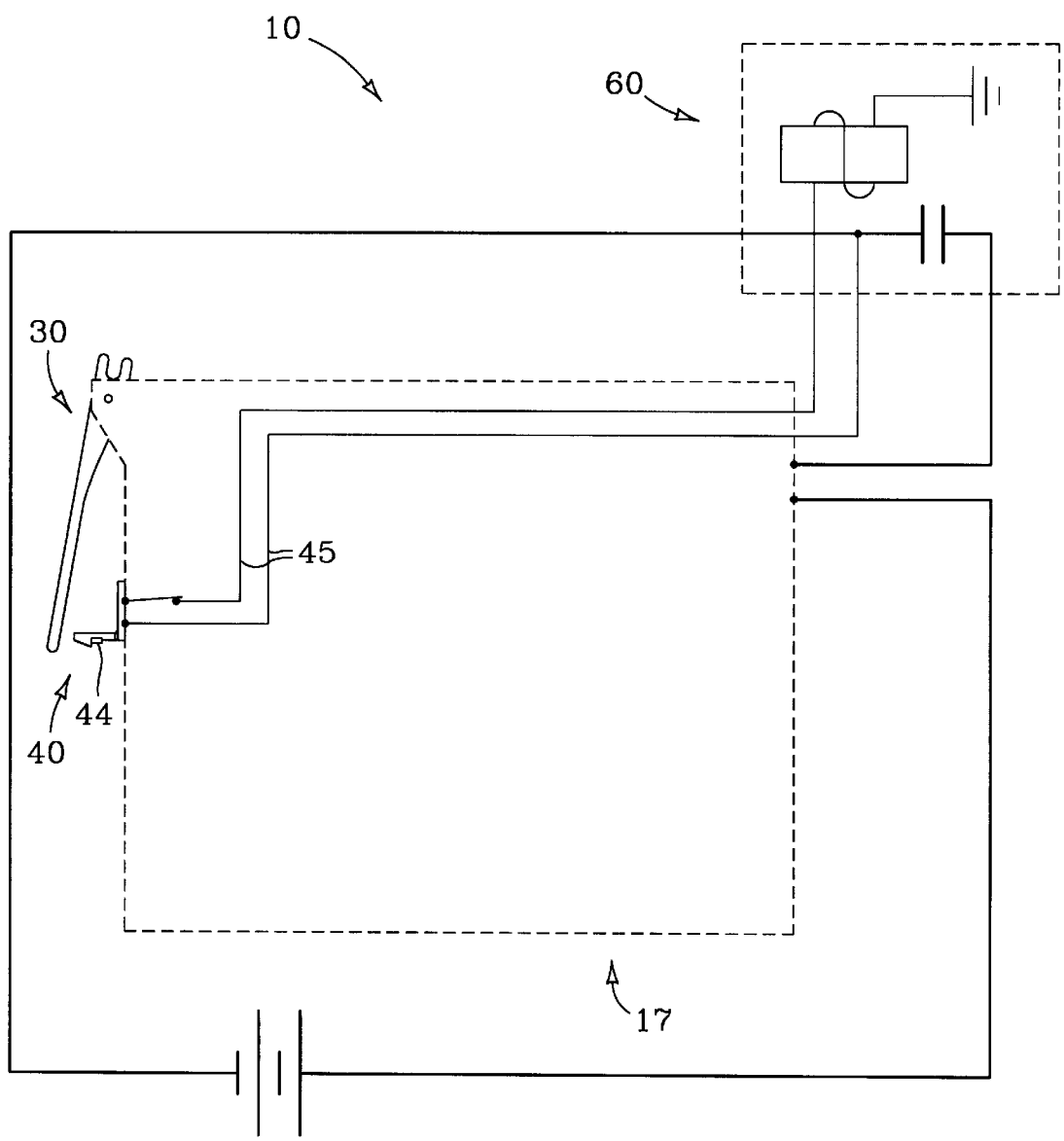
FIG. 14 is a representational schematic diagram of a switch integral to an insert/extract latch assembly.

FIG. 14 is a representational schematic diagram of electronic assembly 10 insert/extract latch release warning assembly 30. Electronic assembly 10 also includes insert/extract latch release warning assembly 30 including retainer 40. Switch 44 is conductively connected is to warning circuit 60 by conductor 45.

While this invention has been described with reference to the detailed embodiments, this is not meant to be construed in a limiting sense. Various modifications to the described embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An insert/extract latch assembly comprising:

a lever;

a retainer selectively engageable with the lever, the retainer including a rotatable member having a neck and a head attached to, extending from and rotatable about the neck, the head configured to retain the lever in an engaged position;

a switch integral to the retainer and selectively engageable between the lever and the retainer;

the lever pivotable between a first position wherein the retainer is selectively disengaged from the lever and the switch and a second position wherein the retainer is selectively engaged with the lever and the switch is engaged between the lever and the retainer.

2. The insert/extract latch assembly of claim 1 wherein the retainer further comprises a biased member including a neck and a head attached to and extending from the neck, the head configured to retain the lever in an engaged position.

3. The insert/extract latch assembly of claim 1 wherein the lever further comprises a cutout configured to permit insertion of the retainer through the cutout.

4. The insert/extract latch assembly of claim 1 wherein the switch further comprises a micro switch.

* * * * *